United States Patent
Tong et al.

(10) Patent No.: US 12,369,502 B2
(45) Date of Patent: Jul. 22, 2025

(54) SELECTOR WITH SUPERLATTICE-LIKE STRUCTURE AND PREPARATION METHOD THEREOF

(71) Applicant: HUAZHONG UNIVERSITY OF SCIENCE AND TECHNOLOGY, Hubei (CN)

(72) Inventors: Hao Tong, Hubei (CN); Lun Wang, Hubei (CN); Weiguo Wang, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 367 days.

(21) Appl. No.: 17/767,927

(22) PCT Filed: Dec. 1, 2021

(86) PCT No.: PCT/CN2021/134706
§ 371 (c)(1),
(2) Date: Apr. 11, 2022

(87) PCT Pub. No.: WO2022/127595
PCT Pub. Date: Jun. 23, 2022

(65) Prior Publication Data
US 2023/0165171 A1    May 25, 2023

(30) Foreign Application Priority Data
Dec. 15, 2020   (CN) .......................... 202011476276.9

(51) Int. Cl.
H10N 70/20 (2023.01)
H10B 63/00 (2023.01)
H10N 70/00 (2023.01)

(52) U.S. Cl.
CPC .......... H10N 70/231 (2023.02); H10B 63/80 (2023.02); H10N 70/023 (2023.02);
(Continued)

(58) Field of Classification Search
CPC .................................................... H10N 70/231
See application file for complete search history.

(56) References Cited

U.S. PATENT DOCUMENTS

2019/0115393 A1*   4/2019   Cheng .............. H10N 70/8825
2020/0111954 A1*   4/2020   Kim ................. H10N 70/8833
2021/0407943 A1*  12/2021   Rajashekhar ........... H01L 25/50

FOREIGN PATENT DOCUMENTS

CN   110571330        12/2019
CN   110571330 A   *  12/2019    ............. H01L 45/12
(Continued)

OTHER PUBLICATIONS

CN Reference Translation (Year: 2019).*
(Continued)

Primary Examiner — Ajay Ojha
Assistant Examiner — Hajar Kolahdouzan
(74) Attorney, Agent, or Firm — JCIPRNET

(57) ABSTRACT

A selector with a superlattice-like structure and a preparation method thereof are provided, which belong to the technical field of micro-nano electronics. The selector includes a substrate, and a first metal electrode layer, a superlattice-like layer, and a second metal electrode layer sequentially stacked on the substrate. The superlattice-like layer includes n+1 first sublayers and n second sublayers alternately stacked periodically. A material of the first sublayer is amorphous carbon, and a material of the second sublayer is a chalcogenide with gating property.

15 Claims, 1 Drawing Sheet

(52) U.S. Cl.
CPC ......... *H10N 70/026* (2023.02); *H10N 70/841* (2023.02); *H10N 70/882* (2023.02); *H10N 70/8845* (2023.02)

(56) References Cited

FOREIGN PATENT DOCUMENTS

| | | |
|---|---|---|
| CN | 111816766 | 10/2020 |
| CN | 111933656 | 11/2020 |
| CN | 112652713 | 4/2021 |

OTHER PUBLICATIONS

CN-110571330-A Reference Translation (Year: 2019).*
"International Search Report (Form PCT/ISA/210) of PCT/CN2021/134706," mailed on Feb. 16, 2022, pp. 1-4.
"Written Opinion of the International Searching Authority (Form PCT/ISA/237) of PCT/CN2021/134706," mailed on Feb. 16, 2022, pp. 1-4.

* cited by examiner

SELECTOR WITH SUPERLATTICE-LIKE STRUCTURE AND PREPARATION METHOD THEREOF

CROSS-REFERENCE TO RELATED APPLICATION

This application is a 371 of international application of PCT application serial no. PCT/CN2021/134706, filed on Dec. 1, 2021, which claims the priority benefit of China application no. 202011476276.9, filed on Dec. 15, 2020. The entirety of each of the above mentioned patent applications is hereby incorporated by reference herein and made a part of this specification.

TECHNICAL FIELD

The disclosure relates to the technical field of micro-nano electronics, and in particular to a selector with a superlattice-like structure and a preparation method thereof.

DESCRIPTION OF RELATED ART

With the vigorous development of big data, cloud computing, and Internet of Things industries, along with the explosive growth of massive information and the ever-expanding market demand, the efficient storage and the convenient transmission of data are strict requirements for storage technology at present. Various new high-performance storage technologies have also emerged accordingly. The phase change memory technology is widely recognized in the industry due to characteristics such as relatively mature material system, simple preparation process, good compatibility with CMOS, high device reliability, and advantages in terms of speed and service life.

There is the issue of leakage current in the phase change memory. The gate current may flow through the surrounding units, thereby affecting the reliability of the device. Therefore, each memory unit must be connected to a selector. The transition of the phase change material from crystalline to amorphous requires the selector to provide a sufficiently large reset current to heat the phase change material to a specific temperature, and during the process, atoms in the chalcogenide material with gating property in the gating tube may experience atomic drift due to high temperature, thereby causing the failure of the selector.

SUMMARY

In order to improve the temperature stability of a selector, the embodiments of the disclosure provide a selector with a superlattice-like structure and a preparation method thereof. The technical solutions are as follows.

In one aspect, an embodiment of the disclosure provides a selector with a superlattice-like structure. The selector includes a substrate, and a first metal electrode layer, a superlattice-like layer, and a second metal electrode layer sequentially stacked on the substrate. The superlattice-like layer includes n+1 first sublayers and n second sublayers alternately stacked periodically. A material of the first sublayer is amorphous carbon, and a material of the second sublayer is a chalcogenide with gating property.

Optionally, a thickness of the first sublayer is 5 to 30 nm.

Optionally, a thickness of the second sublayer is 5 to 20 nm.

Optionally, an alternate stacking periodic number n of the first sublayers and the second sublayers is 5 to 20.

Optionally, the first metal electrode layer and the second metal electrode layer are both inert electrodes, and a material of the inert metal electrode layer includes at least one of Pt, Ti, W, Au, Ru, Al, TiW, TiN, TaN, $IrO_2$, ITO, and IZO, or an alloy material composed of any two or more of Pt, Ti, W, Au, Ru, Al, TiW, TiN, TaN, $IrO_2$, ITO, and IZO.

In another aspect, an embodiment of the disclosure also provides a preparation method of a selector with a superlattice-like structure, which includes:
providing a substrate;
preparing a first metal electrode layer on the substrate;
preparing a superlattice-like layer on the first metal electrode layer, the superlattice-like layer includes n+1 first sublayers and n second sublayers alternately stacked periodically, a material of the first sublayer is amorphous carbon, and a material of the second sublayer is a chalcogenide with gating property; and
preparing a second metal electrode layer on the superlattice-like layer.

Optionally, preparing the superlattice-like layer on the first metal electrode layer includes:
depositing the first sublayers and the second sublayers sequentially on the first metal electrode layer until an alternate stacking periodic number n is completed.

Optionally, the depositing includes adopting a physical vapor deposition, a chemical vapor deposition, a molecular beam epitaxy, an atomic layer deposition, or a metal organic deposition.

Optionally, a thickness of the first sublayer is 5 to 30 nm.

Optionally, a thickness of the second sublayer is 5 to 20 nm.

The beneficial effects of the technical solutions according to the embodiments of the disclosure include at least the following.

(1) The amorphous carbon of the first sublayer is in contact with the first metal electrode layer and the second metal electrode layer as a buffer layer. Since the radius of carbon atoms in the amorphous carbon is very small, the bond length formed between the carbon atoms is very small and is smaller than the diameter of atoms in the chalcogenide, the atoms in the chalcogenide cannot pass through the amorphous carbon layer, thereby preventing atomic drift in the chalcogenide material with gating property due to high temperature, and also avoiding cross contamination due to the introduction of new materials. At the same time, compared to the selector with switching material of the same thickness, due to the low thermal conductivity of the amorphous carbon, the selector of the disclosure can not only ensure that the threshold voltage of the selector is not affected, but also enable the heat diffused to the selector unit when the phase change material melts to be smaller after integration with the phase change memory unit.

(2) Due to the inhibition of crystallization, the thinner the thickness of the chalcogenide, the more stable the bond formation thereof. The insertion of the amorphous carbon layer of the first sublayer separates the chalcogenide with gating property in the thickness direction, so that the thickness of the second sublayer 132 is only 5 to 20 nm, so that the chalcogenide of the second sublayer has very good temperature stability, thereby improving the temperature stability of the entire selector unit.

BRIEF DESCRIPTION OF THE DRAWINGS

In order to illustrate the technical solutions in the embodiments of the disclosure more clearly, the following briefly introduces the drawings used in the description of the embodiments. Obviously, the drawings in the following description are only some embodiments of the disclosure. For persons skilled in the art, other drawings may also be obtained from the drawings without innovative effort.

DETAILED DESCRIPTION OF DISCLOSED EMBODIMENTS

In order for the objectives, the technical solutions, and the advantages of the disclosure to be clearer, the embodiments of the disclosure will be further described in detail below with reference to the drawings.

Figure 1:
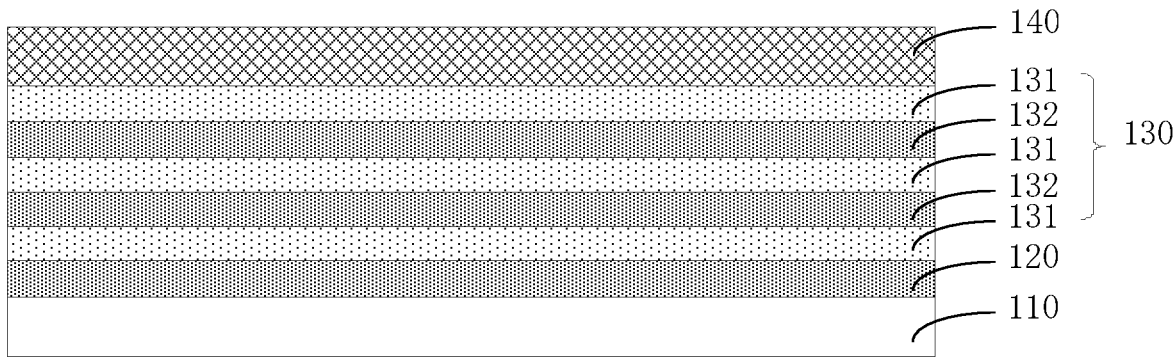
FIG. 1 is a schematic structural diagram of a selector with a superlattice-like structure according to an embodiment of the disclosure.

An embodiment of the disclosure provides a selector with a superlattice-like structure. FIG. 1 is a schematic structural diagram of a selector with a superlattice-like structure according to an embodiment of the disclosure, as shown in FIG. 1.

For a selector with a superlattice-like structure, the selector includes a substrate 110, and a first metal electrode layer 120, a superlattice-like layer 130, and a second metal electrode layer 140 sequentially stacked on the substrate 110. The superlattice-like layer 130 includes n+1 first sublayers 131 and n second sublayers 132 alternately stacked periodically. The material of the first sublayer 131 is amorphous carbon, and the material of the second sublayer 132 is a chalcogenide with gating property.

The amorphous carbon of the first sublayer is in contact with the first metal electrode layer and the second metal electrode layer as a buffer layer. Since the radius of carbon atoms in the amorphous carbon is very small, the bond length formed between the carbon atoms is very small and is smaller than the diameter of atoms in the chalcogenide, the atoms in the chalcogenide cannot pass through the amorphous carbon layer, thereby preventing atomic drift in the chalcogenide material with gating property due to high temperature, and also avoiding cross contamination due to the introduction of new materials. At the same time, compared to the selector with switching material of the same thickness, due to the low thermal conductivity of the amorphous carbon, the selector of the disclosure can not only ensure that the threshold voltage of the selector is not affected, but also enable the heat diffused to the selector unit when the phase change material melts to be smaller during integration with the phase change memory unit.

It can be understood that the chalcogenide with gating property in the second sublayer refers to a chalcogenide that can implement instantaneous transition from a high resistance state to a low resistance state under an electrical signal operation, and spontaneously return to the high resistance state instantaneously when the electrical signal operation is removed.

In some implementations, the chalcogenide with gating property may be a compound composed of one of the first elements (Si, Ge, Sn) combined with one or two of the second elements (S, Se, Te). Specifically, GeTe, GeS, SiTe, SnTe, SnSe, GeSeTe, etc. may be included.

Optionally, the thickness of the first sublayer 131 may be 5 to 30 nm to obtain a better buffer effect and prevent atomic drift in the chalcogenide material with gating property due to high temperature.

Optionally, an alternate stacking periodic number n of the first sublayers and the second sublayers is 5 to 20.

Optionally, the thickness of the second sublayer 132 may be 5 to 20 nm. Due to the inhibition of crystallization, the thinner the thickness of the chalcogenide, the more stable the bond formation thereof. The insertion of the amorphous carbon layer of the first sublayer 131 separates the chalcogenide with gating property in the thickness direction, so that the thickness of the second sublayer 132 is only 2 to 20 nm, so that the chalcogenide of the second sublayer has very good temperature stability, thereby improving the temperature stability of the entire selector unit.

Optionally, the thickness of the first sublayer 131 is greater than the thickness of the second sublayer 132, so as to better physically separate and thermally separate the chalcogenide with gating property.

Optionally, the alternate stacking periodic number n of the first sublayers 131 and the second sublayers 132 is 5 to 20. In this way, the coupling between adjacent wells is stronger, and periodic quantum potential wells are formed in the superlattice-like layer 130, so that the discrete energy levels in each quantum well are expanded into energy bands, thereby reducing the width of the bandgap, so that the threshold voltage of the selector with the superlattice-like layer 130 is lowered, which can not only reduce power consumption, but also better integrate with the memory device unit.

Optionally, the first metal electrode layer 120 and the second metal electrode layer 140 are both inert metal electrode layers. Since in the inert metal electrode layer, it is difficult for the inert metal to combine with other elements, active metal conductive particles in the superlattice-like layer 130 can be effectively prevented from diffusing into the electrode on the one hand, thereby improving the cycle characteristic of the device; device failure due to oxidation or erosion of the inert metal electrode layer can also be effectively prevented on the other hand.

Preferably, the material of the inert metal electrode layer includes at least one of Pt, Ti, W, Au, Ru, Al, TiW, TiN, TaN, $IrO_2$, ITO, and IZO, or an alloy material composed of any two or more of Pt, Ti, W, Au, Ru, Al, TiW, TiN, TaN, $IrO_2$, ITO, and IZO.

Figure 2:
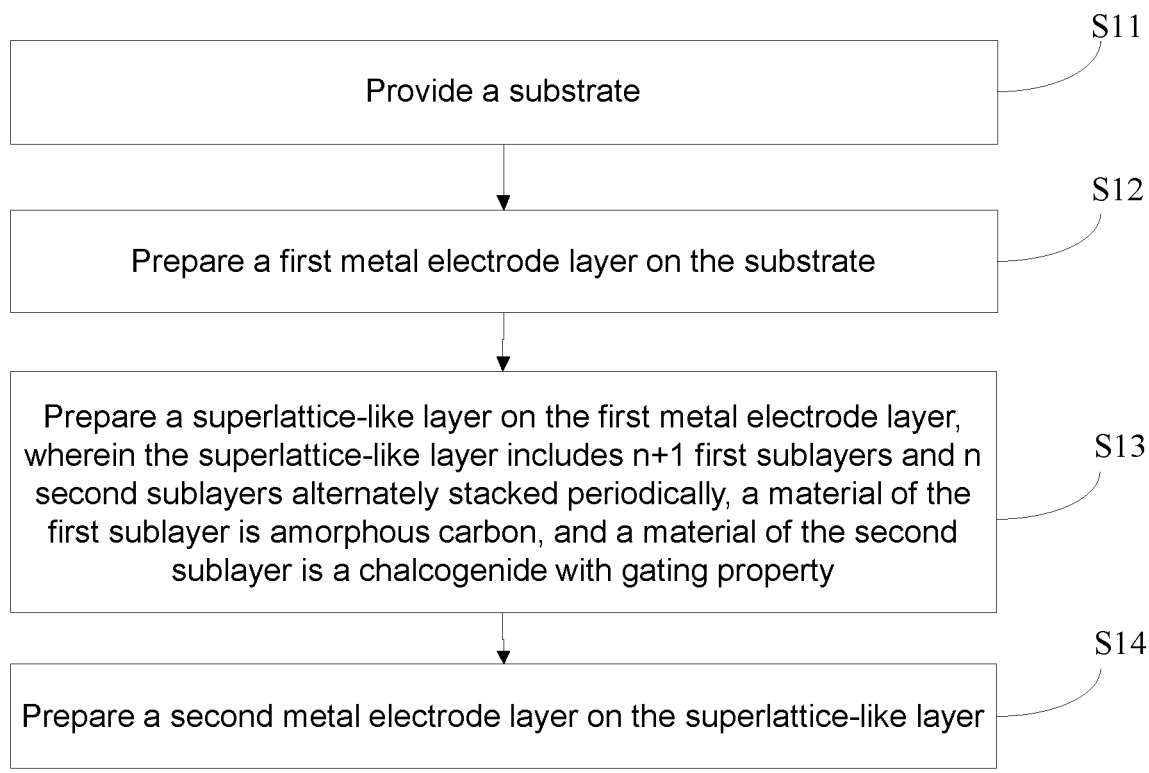
FIG. 2 is a flowchart of a preparation method of a selector with a superlattice-like structure according to an embodiment of the disclosure.

An embodiment of the disclosure provides a preparation method of a selector with a superlattice-like structure. FIG. 2 is a flowchart of a preparation method of a selector with a superlattice-like structure according to an embodiment of the disclosure. As shown in FIG. 2, the method includes:
  providing a substrate;
  preparing a first metal electrode layer on the substrate;
  preparing a superlattice-like layer on the first metal electrode layer, the superlattice-like layer includes n+1 first sublayers and n second sublayers alternately stacked periodically, a material of the first sublayer is amorphous carbon, and a material of the second sublayer is a chalcogenide with gating property; and
  preparing a second metal electrode layer on the superlattice-like layer.

Specifically, the method may include the following.

In step S11, providing a substrate.

In the embodiment, the substrate may be a semiconductor substrate. Specifically, the semiconductor substrate may be a silicon wafer with a crystal phase of <100> and a layer of silicon dioxide on the surface.

During implementation, the substrate may be cleaned first, and the silicon wafers may be sequentially placed in acetone and alcohol for ultrasonic cleaning for about ten minutes; and after the ultrasonication is completed, the residual liquid on the surface is blown and dried with a nitrogen gun for subsequent use. On the cleaned silicon wafer, a dense layer of silicon dioxide is grown using plasma-enhanced chemical vapor deposition or atomic layer deposition.

In step S12, preparing a first metal electrode layer on the substrate.

Specifically, the first metal electrode layer is an inert metal electrode layer, and the material of the inert metal electrode layer includes at least one of Pt, Ti, W, Au, Ru, Al, TiW, TiN, TaN, $IrO_2$, ITO, and IZO, or an alloy material composed of any two or more of Pt, Ti, W, Au, Ru, Al, TiW, TiN, TaN, $IrO_2$, ITO, and IZO.

During implementation, a 100 nm Pt metal layer may be sputtered on the substrate through magnetron as the first metal electrode layer.

In step S13, depositing a superlattice-like layer on the first metal electrode layer. The superlattice-like layer includes n+1 first sublayers and n second sublayers periodically alternately stacked. The material of the first sublayer is amorphous carbon, and the material of the second sublayer is a chalcogenide with gating property.

Specifically, the first sublayers and the second sublayers are sequentially deposited on the first metal electrode layer until an alternate stacking periodic number n is completed, where n is a positive integer. The depositing may include adopting a physical vapor deposition, a chemical vapor deposition, a molecular beam epitaxy, an atomic layer deposition, or a metal organic deposition to form the first sublayer or the second sublayer.

It can be understood that the chalcogenide with gating property in the second sublayer refers to a chalcogenide that can implement instantaneous transition from a high resistance state to a low resistance state under an electrical signal operation, and spontaneously return to the high resistance state instantaneously when the electrical signal operation is removed.

In some implementations, the chalcogenide with gating property may be a compound composed of one of the first elements (Si, Ge, Sn) combined with one or two of the second elements (S, Se, Te). Specifically, GeTe, GeS, SiTe, SnTe, SnSe, GeSeTe, etc. may be included.

Preferably, the alternate stacking periodic number n of the first sublayers and the second sublayers in the superlattice-like layer is 5 to 20.

Optionally, the thickness of the first sublayer may be 5 to 30 nm to obtain a better buffer effect and prevent atomic drift in the chalcogenide material with gating property due to high temperature.

Optionally, the thickness of the second sublayer may be 5 to 20 nm. The thinner the thickness of the second sublayer, the more stable the bond formation thereof, so that the selector has better temperature stability. The insertion of the amorphous carbon layer in the first sublayer separates the chalcogenide with gating property in the thickness direction, so that the thickness of the second sublayer is only 5 to 20 nm, so that the chalcogenide of the second sublayer has very good temperature stability, thereby improving the temperature stability of the entire selector unit.

During implementation, a layer of amorphous carbon material may be deposited on the first metal electrode layer as the first sublayer with a thickness of 5 nm; a layer of GeS material is then grown as the second sublayer with a thickness of 5 nm; an amorphous carbon material layer-a GeS material layer-an amorphous carbon material layer- . . . -GeS-an amorphous carbon material layer are then alternately grown to form the superlattice-like layer. The superlattice-like layer contains n+1 amorphous carbon material layers and n GeS material layers.

The amorphous carbon of the first sublayer is in contact with the first metal electrode layer and the second metal electrode layer as a buffer layer, which can prevent atomic drift in the chalcogenide material with gating property due to high temperature, and also avoid cross contamination due to the introduction of new materials. At the same time, compared to the selector with switching material of the same thickness, the selector of the disclosure can not only ensure that the threshold voltage of the selector is not affected, due to the low thermal conductivity of the amorphous carbon, the selector can also enable the heat diffused to the selector unit when the phase change material melts to be smaller during integration with the phase change memory unit.

In step S14, preparing a second metal electrode layer on the superlattice-like layer.

The second metal electrode layer is prepared on the superlattice-like layer. Specifically, the second metal electrode layer is an inert metal electrode layer, and the material of the inert metal electrode layer includes at least one of Pt, Ti, W, Au, Ru, Al, TiW, TiN, TaN, $IrO_2$, ITO, and IZO, or an alloy material composed of any two or more of Pt, Ti, W, Au, Ru, Al, TiW, TiN, TaN, $IrO_2$, ITO, and IZO.

During implementation, a 100 nm W metal layer may be sputtered on the superlattice-like layer through magnetron as the second metal electrode layer.

The above are only preferred embodiments of the disclosure and are not intended to limit the disclosure. Any modification, equivalent replacement, improvement, etc. made within the spirit and principle of the disclosure shall all be included in the protection scope of the disclosure.

What is claimed is:

1. A selector with a superlattice-like structure, wherein the selector comprises a substrate, and a first metal electrode layer, a superlattice-like layer, and a second metal electrode layer sequentially stacked on the substrate, the superlattice-like layer comprises n+1 first sublayers and n second sublayers alternately stacked periodically, a material of the first sublayer is amorphous carbon, and a material of the second sublayer is a chalcogenide with gating property, wherein the first sublayer is in contact with the first metal electrode layer and the second metal electrode layer, wherein an alternate stacking periodic number n of the first sublayers and the second sublayers is 5 to 20, wherein a thickness of the first sublayer is greater than a thickness of the second sublayer, and the first sublayer physically separates and thermally separates the adjacent second sublayers in a thickness direction.

2. The selector according to claim 1, wherein the thickness of the first sublayer is 5 to 30 nm.

3. The selector according to claim 2, wherein the first metal electrode layer and the second metal electrode layer are both inert electrodes, and a material of the inert electrodes comprises at least one of Pt, Ti, W, Au, Ru, Al, TiW, TiN, TaN, $IrO_2$, ITO, and IZO, or an alloy material composed of any two or more of Pt, Ti, W, Au, Ru, Al, TiW, TiN, TaN, $IrO_2$, ITO, and IZO.

4. The selector according to claim 1, wherein the thickness of the second sublayer is 5 to 20 nm.

5. The selector according to claim 4, wherein the first metal electrode layer and the second metal electrode layer are both inert electrodes, and a material of the inert electrodes comprises at least one of Pt, Ti, W, Au, Ru, Al, TiW, TiN, TaN, $IrO_2$, ITO, and IZO, or an alloy material composed of any two or more of Pt, Ti, W, Au, Ru, Al, TiW, TiN, TaN, $IrO_2$, ITO, and IZO.

6. The selector according to claim 1, wherein the first metal electrode layer and the second metal electrode layer are both inert electrodes, and a material of the inert electrodes comprises at least one of Pt, Ti, W, Au, Ru, Al, TiW, TiN, TaN, $IrO_2$, ITO, and IZO, or an alloy material composed of any two or more of Pt, Ti, W, Au, Ru, Al, TiW, TiN, TaN, $IrO_2$, ITO, and IZO.

7. A preparation method of a selector with a superlattice-like structure, wherein the preparation method comprises:
   providing a substrate;
   preparing a first metal electrode layer on the substrate;
   preparing a superlattice-like layer on the first metal electrode layer, wherein the superlattice-like layer comprises n+1 first sublayers and n second sublayers alternately stacked periodically, a material of the first sublayer is amorphous carbon, and a material of the second sublayer is a chalcogenide with gating property; and
   preparing a second metal electrode layer on the superlattice-like layer,
   wherein the first sublayer is in contact with the first metal electrode layer and the second metal electrode layer,
   wherein an alternate stacking periodic number n of the first sublayers and the second sublayers is 5 to 20,
   wherein a thickness of the first sublayer is greater than a thickness of the second sublayer, and the first sublayer physically separates and thermally separates the adjacent second sublayers in a thickness direction.

8. The preparation method according to claim 7, wherein preparing the superlattice-like layer on the first metal electrode layer comprises:
   sequentially depositing the first sublayers and the second sublayers on the first metal electrode layer until the alternate stacking periodic number n is completed.

9. The preparation method according to claim 8, wherein the depositing comprises adopting a physical vapor deposition, a chemical vapor deposition, a molecular beam epitaxy, an atomic layer deposition, or a metal organic deposition.

10. The preparation method according to claim 9, wherein the thickness of the first sublayer is 5 to 30 nm.

11. The preparation method according to claim 9, wherein the thickness of the second sublayer is 5 to 20 nm.

12. The preparation method according to claim 8, wherein the thickness of the first sublayer is 5 to 30 nm.

13. The preparation method according to claim 8, wherein the thickness of the second sublayer is 5 to 20 nm.

14. The preparation method according to claim 7, wherein the thickness of the first sublayer is 5 to 30 nm.

15. The preparation method according to claim 7, wherein the thickness of the second sublayer is 5 to 20 nm.

* * * * *